United States Patent
Park et al.

(10) Patent No.: US 9,548,466 B2
(45) Date of Patent: Jan. 17, 2017

(54) METHOD OF FORMING A THIN FILM AND AN ELECTRONIC DEVICE

(71) Applicant: Samsung Electronics Co., Ltd., Suwon-Si, Gyeonggi-Do (KR)

(72) Inventors: In Sun Park, Hwaseong-si (KR); Yeong Suk Choi, Suwon-si (KR); Jung Kyu Kim, Seongnam-si (KR); Jong Hyeok Park, Suwon-si (KR)

(73) Assignees: Samsung Electronics Co., Ltd., Gyeonggi-do (KR); Research & Business Foundation of Sungkyunkwan University Sungkyunkwan University, Gyeonggi-do (KR)

( * ) Notice: Subject to any disclaimer, the term of this patent is extended or adjusted under 35 U.S.C. 154(b) by 0 days.

(21) Appl. No.: 13/922,436

(22) Filed: Jun. 20, 2013

(65) Prior Publication Data

US 2014/0179052 A1    Jun. 26, 2014

(30) Foreign Application Priority Data

Dec. 21, 2012    (KR) .................... 10-2012-0151135

(51) Int. Cl.
| | |
|---|---|
| H01L 51/44 | (2006.01) |
| H01L 51/00 | (2006.01) |
| B82Y 10/00 | (2011.01) |
| H01L 51/42 | (2006.01) |

(52) U.S. Cl.
CPC ............. *H01L 51/442* (2013.01); *B82Y 10/00* (2013.01); *H01L 51/003* (2013.01); *H01L 51/0036* (2013.01); *H01L 51/0043* (2013.01); *H01L 51/0047* (2013.01); *H01L 51/4253* (2013.01); *Y02E 10/549* (2013.01); *Y02P 70/521* (2015.11)

(58) Field of Classification Search
CPC .................................................... H01L 51/442
See application file for complete search history.

(56) References Cited

U.S. PATENT DOCUMENTS

| | | | |
|---|---|---|---|
| 6,966,997 B1 | 11/2005 | Inganas et al. | |
| 7,332,369 B2 | 2/2008 | Veres et al. | |
| 7,935,565 B2 | 5/2011 | Brown et al. | |
| 2009/0020220 A1* | 1/2009 | Aikawa et al. | 156/245 |
| 2011/0076448 A1* | 3/2011 | Agarwal et al. | 428/138 |
| 2011/0077318 A1* | 3/2011 | Nakamura | C08F 222/1006 522/179 |

OTHER PUBLICATIONS

Dong Hwan Wang et al., Active Layer Transfer by Stamping Technique for Polymer Solar Cells: Synergistic Effect of TiO$_x$ Interlayer, Organic Electronics 11, 2010, pp. 599-603.
Bin-Da Chan et al., Fabrication of Organic Flexible Electrodes Using Transfer Stamping Process, Microelectronic Engineering 86, 2009, pp. 586-589.

* cited by examiner

*Primary Examiner* — Alexander Ghyka
(74) *Attorney, Agent, or Firm* — Harness, Dickey & Pierce, P.L.C.

(57) ABSTRACT

A method of forming a thin film includes coating one side of a transferring stamp including a hydrophilic polymer layer with a hydrophilic solution to form a transfer layer, and transferring the transfer layer to the substrate.

18 Claims, 19 Drawing Sheets

METHOD OF FORMING A THIN FILM AND AN ELECTRONIC DEVICE

CROSS-REFERENCE TO RELATED APPLICATION

This application claims priority to and the benefit of Korean Patent Application No. 10-2012-0151135 filed in the Korean Intellectual Property Office on Dec. 21, 2012, the entire contents of which are incorporated herein by reference.

BACKGROUND

1. Field

Some example embodiments provide a method of forming a thin film, an electronic device, and a method of manufacturing the electronic device.

2. Description of the Related Art

An electronic device such as a solar cell, an organic light emitting diode, and the like includes a plurality of thin films such as a conductive thin film, an insulating thin film, and a semiconductor thin film. The thin film may have thin film characteristics depending on a method of forming the same.

For example, a solar cell is a photoelectric conversion device that transforms solar energy into electrical energy. The solar cell produces electrical energy by absorbing solar energy in a photoactive layer including a p-type semiconductor and an n-type semiconductor, generating an electron-hole pair (EHP) therein, transferring the generated electrons and holes to the n-type semiconductor and p-type semiconductor, respectively, and collecting the electrons and holes in each electrode.

The solar cell may further include an additional thin film between a photoactive layer and an electrode in order to increase mobility of the electrons and holes. Electrical properties of the thin film may be changed depending on a method of forming the thin film, and may have an effect on efficiency and life-span of a solar cell.

SUMMARY

An example embodiment provides a method of forming a thin film being capable of having improved thin film characteristics.

Another example embodiment provides a method of manufacturing an electronic device using the method of forming a thin film.

According to an example embodiment, a method of forming a thin film includes coating one side of a transferring stamp including a hydrophilic polymer layer with a hydrophilic solution to form a transfer layer, and transferring the transfer layer to a substrate is provided.

The hydrophilic polymer layer may include a curable resin and a hydrophilic compound having at least one of an ethylene glycol group and a hydroxy group.

The hydrophilic compound may include at least one of poly(ethylene glycol)diacrylate and 2-hydroxy-2-methyl propiophenone.

The curable resin may include polyurethane acrylate.

The one side of the transferring stamp may include a support supporting the hydrophilic polymer layer, and the support may include one of polycarbonate (PC), polymethylmethacrylate (PMMA), polyethersulfone (PES), polyethylene terephthalate (PET), polystyrene (PS), a copolymer thereof, and a combination thereof.

The hydrophilic polymer layer may have a contact angle of less than or equal to about 80 degrees.

The one side of the transferring stamp may be coated by a process including one of spin coating, slit coating, and inkjet printing. The transfer layer may be transferred to the substrate by being pressed at about 20 to 200° C. on the substrate. The hydrophilic solution may be an acidic solution having pH of 1 to 6.

The hydrophilic solution may include one of poly(3,4-ethylenedioxythiophene):poly(styrenesulfonate) (PEDOT:PSS), poly(3,4-ethylenedioxythiophene):poly(styrenesulfonate):poly(ferricsulfonate):Nafion® (PEDOT:PSS:PFS:Nafion®), and a combination thereof. The substrate may include one of indium tin oxide (ITO) and indium zinc oxide (IZO).

According to yet another example embodiment, a method of manufacturing an electronic device includes forming a first electrode, and forming an auxiliary layer on the first electrode. This forming may include coating one side of a transferring stamp including a hydrophilic polymer layer with a hydrophilic solution to form a transfer layer and transferring the transfer layer onto the first electrode. The method further includes forming an active layer on the auxiliary layer, and forming a second electrode on the active layer.

BRIEF DESCRIPTION OF THE DRAWINGS

These and/or other aspects will become apparent and more readily appreciated from the following description of the embodiments, taken in conjunction with the accompanying drawings of which.

DETAILED DESCRIPTION

Figure 1:
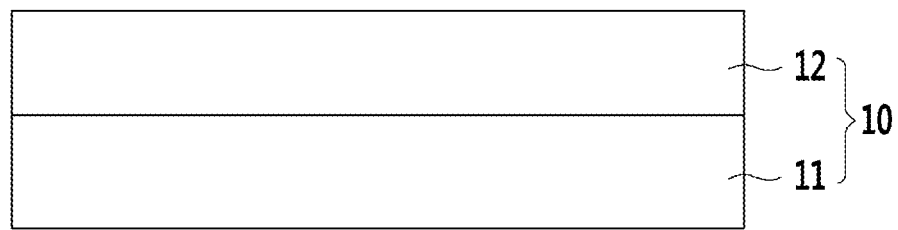
FIGS. 1 to 5 are cross-sectional views sequentially showing a method of forming a thin film according to an example embodiment.

Example embodiments will hereinafter be described in detail referring to the following accompanied drawings, and may be more easily performed by those who have common knowledge in the related art. However, these embodiments are only examples, and the inventive concepts are not limited thereto.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Hereinafter, a method of forming a thin film according to an example embodiment is described. FIGS. 1 to 5 are cross-sectional views sequentially showing a method of forming a thin film according to an example embodiment.

First, a transferring stamp used for a method of forming a thin film according to an example embodiment is prepared. Referring to FIG. 1, the transferring stamp 10 includes a support 11 and a hydrophilic polymer layer 12 disposed on the support 11.

The support 11 supports the hydrophilic polymer layer 12 and may include, for example, polycarbonate (PC), polymethylmethacrylate (PMMA), polyethersulfone (PES), polyethylene terephthalate (PET), polystyrene (PS), a copolymer thereof, or a combination thereof.

The hydrophilic polymer layer 12 is coated on one side of the support 11, and includes a curable resin and a hydrophilic compound. The curable resin may include at least one of a thermally curable resin and a photocurable resin, for example, polyurethane acrylate.

The hydrophilic compound may have, for example, at least one of an ethylene glycol group and a hydroxyl group. The hydrophilic compound may include, for example, at least one of poly(ethylene glycol)diacrylate and 2-hydroxy-2-methyl propiophenone, but is not limited thereto.

The hydrophilic polymer layer 12 has a hydrophilic property, and may have a contact angle of less than or equal to about 80 degrees. Herein, the contact angle may be obtained by dripping a water droplet on the surface of the hydrophilic polymer layer 12 and measuring an angle between the hydrophilic polymer layer 12 and the water droplet. The hydrophilic polymer layer 12 may have a contact angle of greater than 0 degrees and less than or equal to about 60 degrees.

Figure 2:
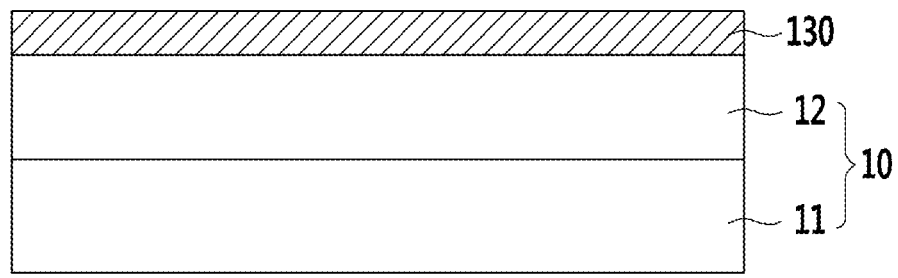

Referring to FIG. 2, a transfer layer 30 is formed on one surface of the transferring stamp 10. The transfer layer 30 may be formed by coating a hydrophilic solution including a material for transfer. The coating may include, for example, spin coating, slit coating, and inkjet printing. For example, the spin coating may be performed at about 500 to 5000 rpm for about 1 second to 60 seconds.

The hydrophilic solution may be prepared by dissolving a material for transfer in a solvent and, for example, an acidic solution having pH of 1 to 6. The hydrophilic solution may include, for example, poly(3,4-ethylenedioxythiophene):poly(styrenesulfonate) (PEDOT:PSS) or poly(3,4-ethylenedioxythiophene):poly(styrenesulfonate):poly(ferricsulfonate):Nafion® (a product of Dupont) (PEDOT:PSS:PFS:Nafion®).

Figure 3:
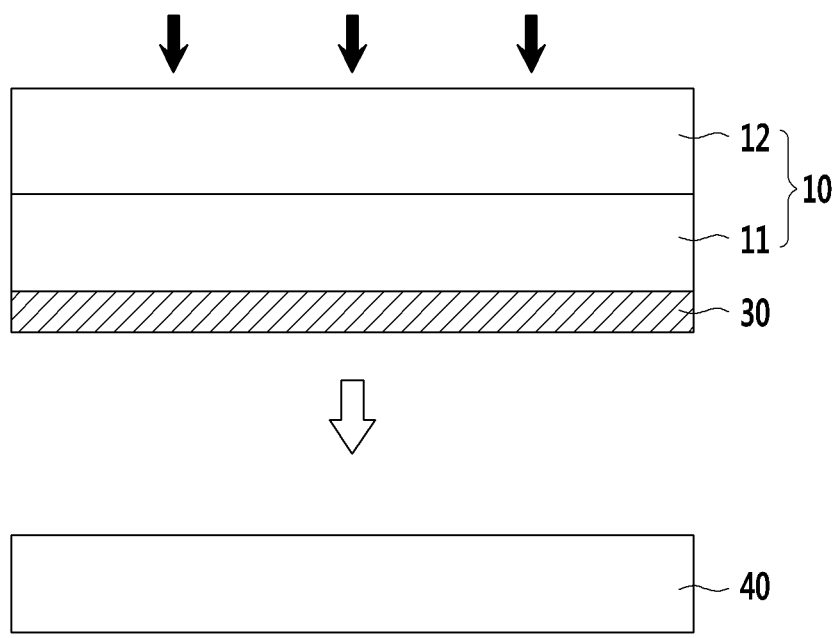
Figure 4:
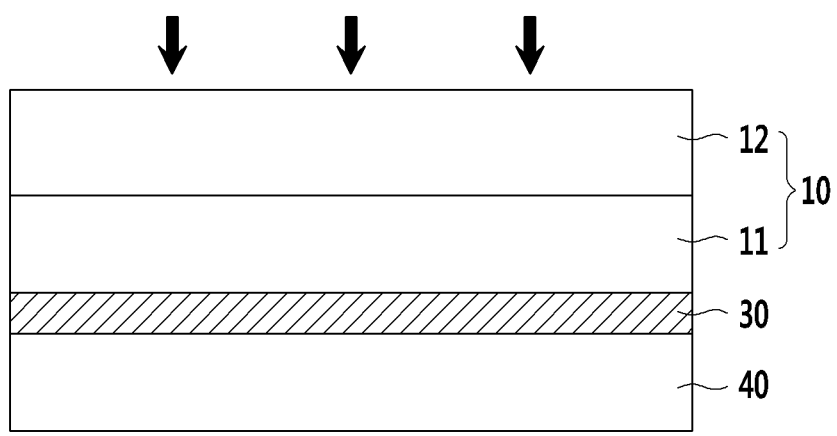

Referring to FIGS. 3 and 4, the transferring stamp 10 coated with the transfer layer 30 is disposed on a substrate 40 and pressed with a given (or, alternatively predetermined) pressure to transfer the transfer layer 30 to the substrate 40. The substrate 40 is not particularly limited, and may include, for example, indium tin oxide (ITO) or indium zinc oxide (IZO). The transfer layer 30 may be pressed, for example, at a temperature of about 20 to 200° C. and with a pressure of about $1.5 \times 10^5$ to $2.5 \times 10^6$ N/m².

Figure 5:
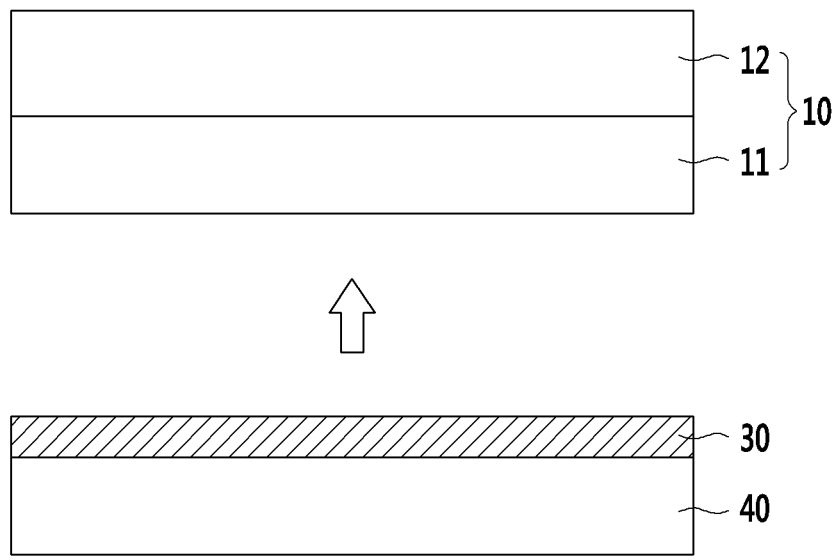

Referring to FIG. 5, when the transfer layer 30 is transferred, the transferring stamp 10 is separated from the substrate 40. The transfer layer 30 is heat-treated and formed on the substrate 40. The heat treatment may be performed at about 100 to 200° C., but may be omitted.

The aforementioned method of forming a thin film may be applied to form a hydrophilic thin film on a substrate, for example, a hydrophilic thin film on indium tin oxide (ITO) or indium zinc oxide (IZO), or an acidic hydrophilic thin film on indium tin oxide (ITO) or indium zinc oxide (IZO).

The aforementioned method may prevent or reduce the indium tin oxide (ITO) or indium zinc oxide (IZO) from being directly exposed to an acidic solution, unlike the spin coating method, and thus decrease the amount of indium (In) permeated or diffused into the transfer layer, and resultantly prevent or reduce degradation of electrical properties of the indium tin oxide (ITO) or indium zinc oxide (IZO) and simultaneously prevent or reduce transformation of physical and electrical properties of the transfer layer.

The method of forming the thin film may be particularly applied to an electronic device such as a solar cell, an organic light emitting diode device, and the like.

Figure 6:
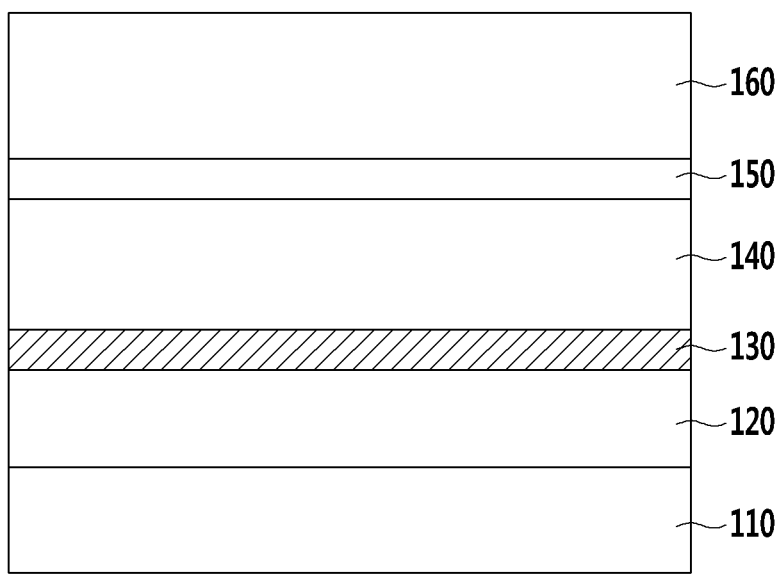
FIG. 6 is a cross-sectional view showing a solar cell according to an example embodiment.

Hereinafter, a solar cell as an example of an electronic device is described. FIG. 6 is a cross-sectional view showing a solar cell according to an example embodiment.

Referring to FIG. 6, a solar cell 100 according to an example embodiment includes a substrate 110, a lower electrode 120, an auxiliary layer 130, a photoactive layer 140, an auxiliary layer 150, and an upper electrode 160.

The substrate 110 may be made of a light-transmitting material, for example, an inorganic material such as glass or an organic material such as polycarbonate, polymethylmethacrylate, polyethylene terephtalate, polyethylene naphtalate, polyamide, polyethersulfone, or a combination thereof.

The lower electrode 120 may be made of a transparent conductor made of indium tin oxide (ITO) or indium zinc oxide (IZO). The lower electrode 120 may be an anode or a cathode.

The auxiliary layer 130 may increase charge mobility between the lower electrode 120 and the photoactive layer 140, and may be, for example, at least one selected from a hole injection layer (HIL), a hole transport layer (HTL), an electron blocking layer (EBL), an electron injection layer (EIL), an electron transport layer (ETL), and a hole blocking layer (HBL), but is not limited thereto. The auxiliary layer 130 may include, for example, PEDOT:PSS, PEDOT:PSS: PFS:Nafion®, or a combination thereof but is not limited thereto.

The photoactive layer 140 may be made of a photoactive material including an electron acceptor made of an n-type semiconductor material and an electron donor made of a p-type semiconductor material.

The electron acceptor and electron donor may form, for example, a bulk heterojunction structure. In the case of forming the bulk heterojunction, when electron-hole pairs excited by light absorbed in the photoactive layer 140 are diffused and reach the interface of the electron acceptor and electron donor, electrons and holes are separated by the electron affinity difference of the two materials forming the interface, and the electrons are moved to a cathode through the electron acceptor while the holes are moved to an anode through the electron donor, generating a photocurrent.

The photoactive material may include, for example, at least two selected from polyaniline; polypyrrole; polythiophene; poly(p-phenylenevinylene); benzodithiophene; thienothiophene; MEH-PPV (poly[2-methoxy-5-(2'-ethylhexyloxy)-1,4-phenylenevinylene]); MDMO-PPV (poly[2-methoxy-5-(3,7-dimethyloctyloxy)-1,4-phenylenevinylene]); pentacene; perylene; poly(3,4-ethylenedioxythiophene) (PEDOT), poly(3-alkylthiophene); poly((4,8-bis(octyloxy)benzo[1,2-b:4,5-b']dithiophen)-2,6-diyl-alt-(2-((dodecyloxy)carbonyl)thieno [3,4-b]thiophene)-3,6-diyl) (PTB1); poly((4,8-bis(2-ethylhexyloxy)benzo[1,2-b:4,5-b']dithiophene)-2,6-diyl-alt-(2-((2-ethylhexyloxy)carbonyl)-3-fluorothieno[3,4-b] thiophene)-3,6-diyl) (PTB7); phthalocyanine; tin(II) phthalocyanine (SnPc); copper phthalocyanine; triarylamine; benzidine; pyrazoline; styrylamine; hydrazone; carbazole; thiophene; 3,4-ethylenedioxythiophene (EDOT); pyrrole; phenanthrene; tetracene; naphthalene; rubrene; 1,4,5, 8-naphthalene-tetracarboxylic dianhydride (NTCDA); poly (3-hexylthiophene) (P3HT); Alq$_3$; fullerene (C60, C70, C74, C76, C78, C82, C84, C720, C860, and the like); a fullerene derivative such as 1-(3-methoxy-carbonyl)propyl-1-phenyl (6,6)C61(PCBM), C71-PCBM, C84-PCBM, bis-PCBM, and the like; an inorganic semiconductor such as CdS, CdTe, CdSe, ZnO, and the like; a derivative thereof; a copolymer thereof; or a combination thereof, but is not limited thereto.

When two or more kinds of photoactive materials having different energy levels form a bulk heterojunction, a material having a relatively low LUMO (lowest unoccupied molecular orbital) level may be used for the electron acceptor, while a material having a relatively high LUMO level may be used for the electron donor.

The auxiliary layer 150 may increase charge mobility between the photoactive layer 140 and the upper electrode 160 and may be, for example at least one selected from an electron injection layer (EIL), an electron transport layer (ETL), a hole blocking layer (HBL), a hole injection layer (HIL), a hole transport layer (HTL), and an electron blocking layer (EBL), but is not limited thereto. The auxiliary layer 150 may include, for example, a metal oxide such as TiO$_x$ (0<x≤2).

The upper electrode 160 may be made of a transparent conductor such as indium tin oxide (ITO), indium doped zinc oxide (IZO), tin oxide (SnO$_2$), aluminum doped zinc oxide (AZO), gallium doped zinc oxide (GZO), and the like, and the other may be made of an opaque conductor such as aluminum (Al), silver (Ag), gold (Au), lithium (Li), and the like. The upper electrode 160 may be a cathode or an anode.

Hereinafter, a method of manufacturing the solar cell is described referring to FIGS. 7 to 12 and FIG. 6. FIGS. 7 to 12 are cross-sectional views sequentially showing a method of manufacturing the solar cell according to an example embodiment.

First, a transferring stamp 10 including a support 11 and a hydrophilic polymer layer 12 is prepared. The support 11 supports the hydrophilic polymer layer 12 and may include, for example, polycarbonate (PC), polymethylmethacrylate (PMMA), polyethersulfone (PES), polyethylene terephtalate (PET), polystyrene (PS), a copolymer thereof, or a combination thereof. The hydrophilic polymer layer 12 may be coated on one side of the support 11, and may include a curable resin and a hydrophilic compound.

The curable resin may include at least one of a thermally curable resin and a photocurable resin, for example, polyurethane acrylate. The hydrophilic compound may have, for example, at least one of an ethylene glycol group and a hydroxy group. The hydrophilic compound may include, for example, at least one of poly(ethylene glycol)diacrylate and 2-hydroxy-2-methylpropinophenone, but is not limited thereto.

The hydrophilic polymer layer 12 may have hydrophilic properties, and may have a contact angle of less than or equal to about 80 degrees. The hydrophilic polymer layer may have a contact angle of greater than 0 degrees and less than or equal to about 60 degrees.

Figure 7:
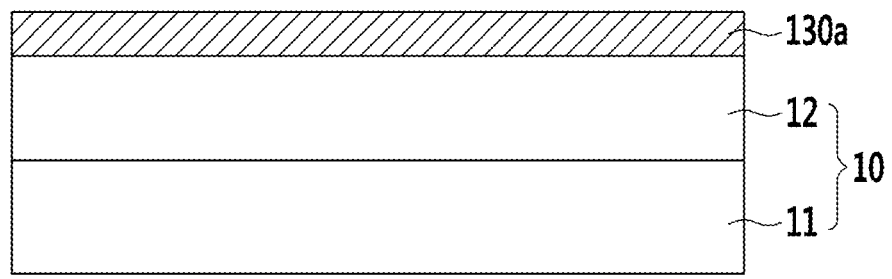
FIGS. 7 to 12 are cross-sectional views sequentially showing a method of manufacturing the solar cell according to an example embodiment.

Referring to FIG. 7, a transfer layer for an auxiliary layer 130a may be formed on one surface of the transferring stamp 10. The transfer layer for an auxiliary layer 130a may be formed by coating a hydrophilic solution including a material for transfer, and the coating may include, for example, spin coating, slit coating, and inkjet printing. For example, the spin coating may be performed at about 500 to 5000 rpm for about 1 second to 60 seconds.

The hydrophilic solution may be prepared by dissolving a material for transfer in a solvent, and may include, for example, an acidic solution having pH of 1 to 6. The hydrophilic solution may include, for example, PEDOT:PSS or PEDOT:PSS:PFS:Nafion® (a product of Dupont).

Figure 8:
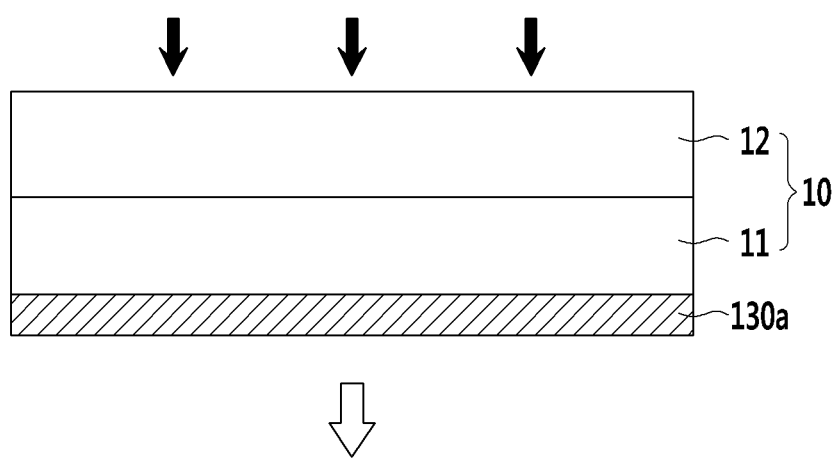
Figure 8:
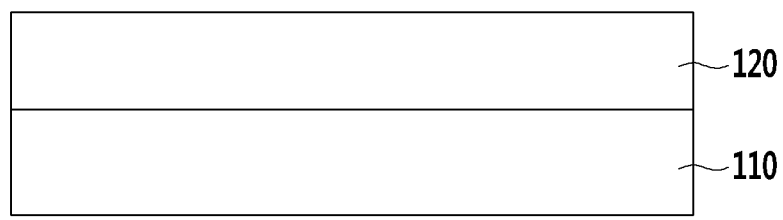
Figure 9:
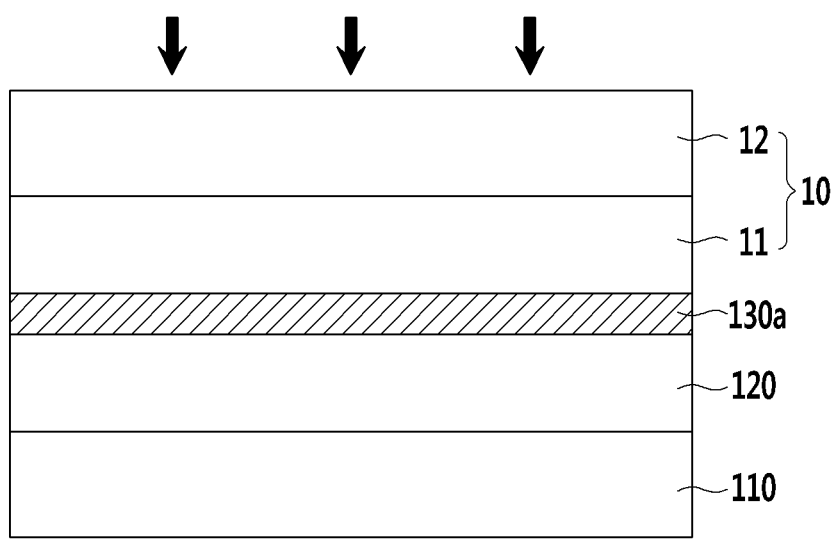

Referring to FIGS. 8 and 9, a lower electrode 120 formed of indium tin oxide (ITO) or indium zinc oxide (IZO) is formed on a substrate 110, and a transferring stamp 10 coated with a transfer layer for forming an auxiliary layer 130a is disposed thereon. Herein, the lower electrode 120 is disposed to face the transfer layer for forming the auxiliary layer 130a.

Then, the transfer layer for forming the auxiliary layer 130a is transferred to the lower electrode 120 by pressing one surface of the transferring stamp 10. The transferring process may be performed, for example, at a temperature of about 20 to 200° C. with a pressure of about $1.5 \times 10^5$ to $2.5 \times 10^6$ N/m².

Figure 10:
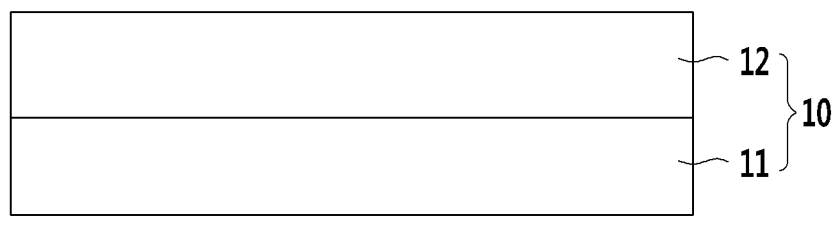
Figure 10:
Figure 10:
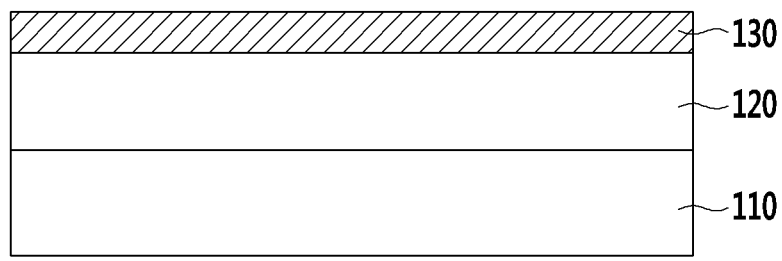

Referring to FIG. 10, after the transfer layer for forming the auxiliary layer 130a is transferred, the transferring stamp 10 is separated from the lower electrode 120. The transfer layer for forming the auxiliary layer 130a is heat-treated to form the auxiliary layer 130 on the lower electrode 120. The heat treatment may be performed at about 100 to 200° C., but may be omitted if it is unnecessary. Accordingly, the auxiliary layer 130 may be formed on the lower electrode 120.

Figure 11:
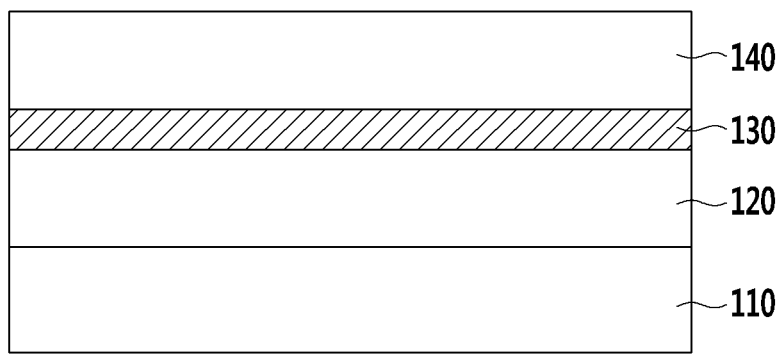

Referring to FIG. 11, a photoactive layer 140 is formed on the auxiliary layer 130. The photoactive layer 140 may be formed, for example, in a solution method such as spin coating, inkjet printing, and the like, or in a chemical vapor deposition method.

Figure 12:
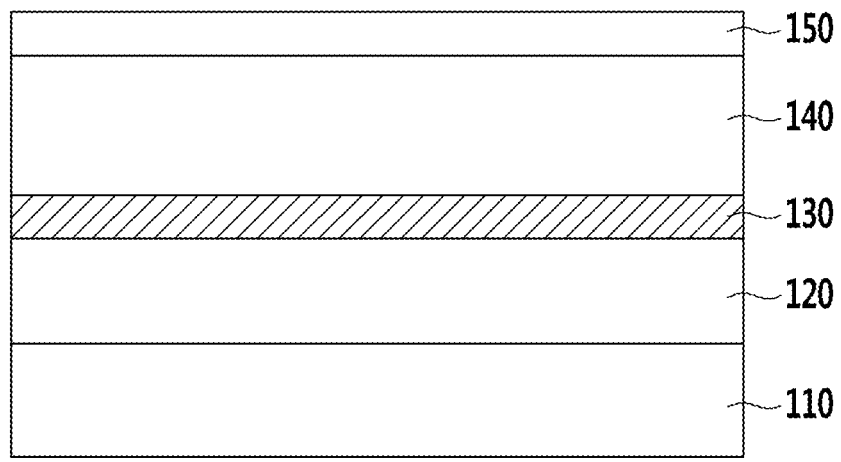

Referring to FIG. 12, an auxiliary layer 150 is formed on the photoactive layer 140. The auxiliary layer 150 may be formed in a solution method such as spin coating, inkjet printing, and the like, or in a chemical vapor deposition method.

Referring to FIG. 6, an upper electrode 160 is formed on the auxiliary layer 150. The upper electrode 160 may be formed by, for example, sputtering or depositing a conductor.

The auxiliary layer 130 formed in the aforementioned method may prevent or reduce the lower electrode 120 formed of indium tin oxide (ITO) or indium zinc oxide (IZO) from being directly exposed to an acidic solution, unlike the one formed in a spin coating method, and thus decreasing the amount of indium (In) permeated or diffused into the auxiliary layer 130 and resultantly preventing or reducing degradation of electrical properties of the indium tin oxide (ITO) or indium zinc oxide (IZO) and simultaneous transformation of physical and electrical properties of the auxiliary layer 130.

Hereinafter, this disclosure is illustrated in more detail with reference to examples and comparative examples. However, they are examples of the inventive concepts, and this disclosure is not limited thereto.

Formation of Hydrophilic Thin Film

Preparation Example 1

A silicon wafer is surface-treated with trichloro-(1H,1H, 2H,2H-perfluorooctyl)silane (FOTS), and then a hydrophilic polymer solution including polyurethane acrylate (Norland Optical Adhesive, Edmund Optics Inc.), polyethylene glycol diacrylate (a weight average molecular weight of 575), and 2-hydroxy-2-methylpropinophenone is sprayed thereon at room temperature. Next, the silicon wafer sprayed with the hydrophilic polymer solution is covered with a polycarbonate rigiflex mold, and UV rays of a wavelength of 365 nm are radiated to cure the hydrophilic polymer solution. The polycarbonate mold is separated from the silicon wafer, fabricating a transferring stamp coated with the hydrophilic polymer solution.

Then, a PEDOT:PSS solution is spin-coated on the transferring stamp and dried to form a PEDOT:PSS transfer layer. The transferring stamp having the PEDOT:PSS transfer layer is disposed on an ITO glass. Next, the PEDOT:PSS transfer layer is transferred onto the ITO glass by pressing one surface of the transferring stamp. Then, the transferring stamp is separated from the ITO glass and heat-treated to form a PEDOT:PSS layer.

Comparative Preparation Example 1

Then, a PEDOT:PSS solution is spin-coated on an ITO glass and dried to form a PEDOT:PSS layer.

Comparative Preparation Example 2

A PEDOT:PSS solution is spin-coated on a polydimethyl siloxane (PDMS) (Sylgard® 184, Dow Corning Co.) transferring stamp and drying to form a PEDOT:PSS transfer layer. The PDMS transferring stamp coated with the PEDOT:PSS transfer layer is disposed on an ITO glass. Next, the PEDOT:PSS transfer layer is transferred onto the ITO glass by pressing one surface of the PDMS transferring stamp. Then, the PDMS transferring stamp is separated from the ITO glass to form a PEDOT:PSS layer.

Evaluation

Evaluation 1

The PEDOT:PSS layers according to Preparation Example 1 and Comparative Preparation Example 1 are analyzed using x-ray photoelectron spectroscopy (XPS) to compare the amount of indium (In) atoms therein. The results are provided in FIG. 13.

Figure 13:
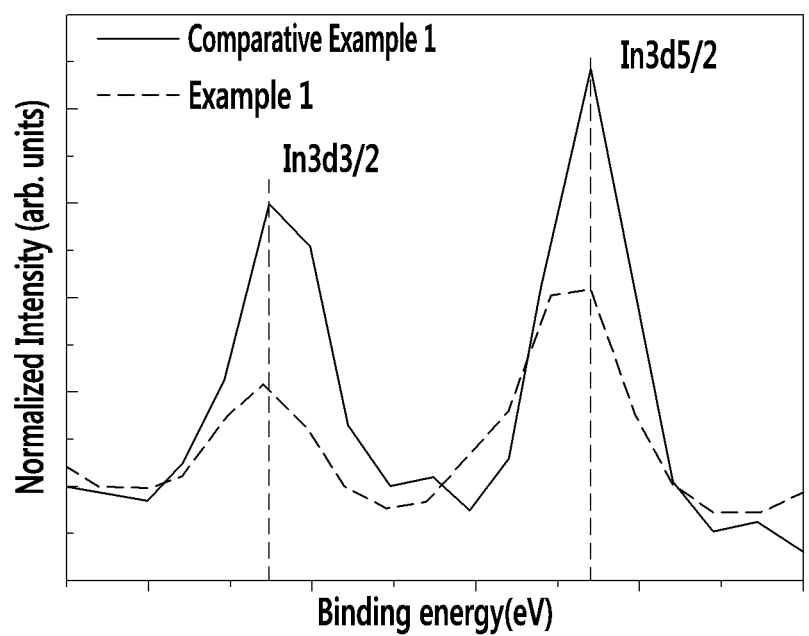
FIG. 13 is an XPS graph showing the amount of indium atoms (In) in poly(3,4-ethylenedioxythiophene):poly(styrenesulfonate) PEDOT:PSS layers according to Preparation Example 1 and Comparative Preparation Example 1.

FIG. 13 is an XPS graph showing the amount of indium (In) atoms on the PEDOT:PSS layers according to Preparation Example 1 and Comparative Preparation Example 1.

Referring to FIG. 13, the PEDOT:PSS layer according to Preparation Example 1 includes indium (In) atoms in a smaller amount than the one according to Comparative Preparation Example 1. Accordingly, the PEDOT:PSS layer according to Preparation Example 1 includes less indium atoms (In) diffused from the indium tin oxide (ITO) than the one according to Comparative Preparation Example 1.

Evaluation 2

The PEDOT:PSS layers according to Preparation Example 1 and Comparative Preparation Examples 1 and 2 and an ITO forming no PEDOT:PSS layers are measured regarding the average surface roughness (RMS roughness) using an atomic force microscope (AFM).

The results are provided in Table 1.

TABLE 1

|  | Average surface roughness (RMS roughness, nm) |
|---|---|
| Preparation Example 1 | 2.27 |
| Comparative Preparation Example 1 | 2.63 |
| Comparative Preparation Example 2 | 3.37 |
| ITO | 3.81 |

Referring to Table 1, the PEDOT:PSS layer according to Preparation Example 1 has lower average surface roughness than the PEDOT:PSS layers according to Comparative Preparation Examples 1 and 2 and the ITO forming no PEDOT:PSS layer. Accordingly, the PEDOT:PSS layer according to Preparation Example 1 has an improved surface characteristic.

Manufacture of Solar Cell

Example 1

A 150 nm-thick ITO anode is sputtered on a 1 mm-thick transparent glass substrate. Next, a PEDOT:PSS solution is spin-coated on the transferring stamp according to Preparation Example 1 and dried, to form a PEDOT:PSS transfer layer, and then the transferring stamp coated with the PEDOT:PSS transfer layer is disposed on the ITO anode. The PEDOT:PSS transfer layer is transferred onto the ITO anode by pressing one surface of the transferring stamp. The transferring stamp is separated to form a PEDOT:PSS layer on the ITO anode. Next, a solution prepared by dissolving poly(3-hexylthiophene) (P3HT) and C61-PCBM in chlorobenzene is spin-coated on the PEDOT:PSS layer to form a photoactive layer. Then, an 80 nm-thick aluminum (Al) cathode is formed on the photoactive layer, fabricating a solar cell.

Example 2

A solar cell is fabricated according to the same method as Example 1, except for using a compound represented by the following formula A (a weight average molecular weight: 115,000) and C71-PCBM instead of the poly(3-hexylthiophene) (P3HT) and C61-PCBM.

Comparative Example 1

A 150 nm-thick ITO anode is sputtered on a 1 mm-thick transparent glass substrate. Next, a PEDOT:PSS solution is spin-coated on the ITO anode and dried to form a PEDOT:PSS layer. Then, a solution prepared by dissolving poly(3-hexylthiophene) (P3HT) and C61-PCBM in chlorobenzene is spin-coated on the PEDOT:PSS layer, forming a photoactive layer. Then, an 80 nm-thick aluminum (Al) cathode is formed on the photoactive layer, fabricating a solar cell.

Comparative Example 2

A solar cell is fabricated according to the same method as Comparative Example 1, except for using a compound represented by the above formula A and C71-PCBM instead of the poly(3-hexylthiophene) (P3HT) and C61-PCBM.

Comparative Example 3

A 150 nm-thick ITO anode is sputtered on a 1 mm-thick transparent glass substrate. Next, a PEDOT:PSS solution is spin-coated on the PDMS transferring stamp according to Comparative Preparation Example 2 and dried to form a PEDOT:PSS transfer layer, and the PDMS transferring stamp coated with the PEDOT:PSS transfer layer is disposed on the ITO anode. Then, the PEDOT:PSS transfer layer is transferred onto the ITO anode by pressing one surface of the PDMS transferring stamp. The PDMS transferring stamp is separated from the ITO anode to form a PEDOT:PSS layer on the ITO anode. Next, a solution prepared by dissolving poly(3-hexylthiophene) (P3HT) and C61-PCBM in chlorobenzene is coated on the PEDOT:PSS layer to form a photoactive layer. Then, an 80 nm-thick aluminum (Al) cathode is formed on the photoactive layer, fabricating a solar cell.

Evaluation

Evaluation 3-1

The solar cells according to Example 1 and Comparative Example 1 are evaluated regarding their life-span characteristic.

The life-span characteristic is evaluated by comparing current density and efficiency change of the solar cells according to Example 1 and Comparative Example 1, while the solar cells are stored for 1200 hours in the air and operated if necessary.

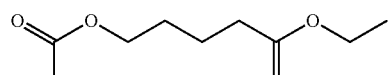

[Chemical Formula A]

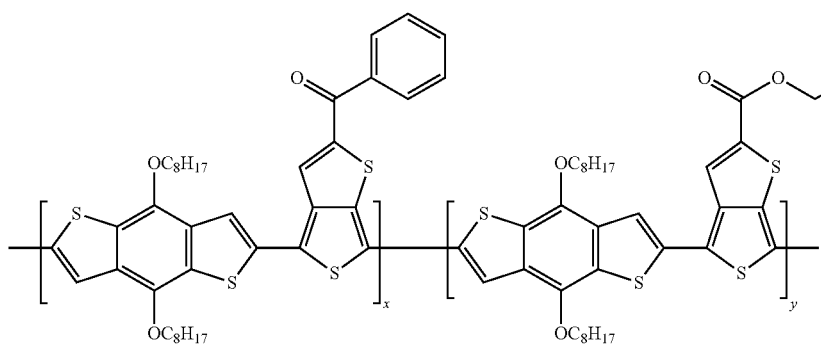

Figure 14:
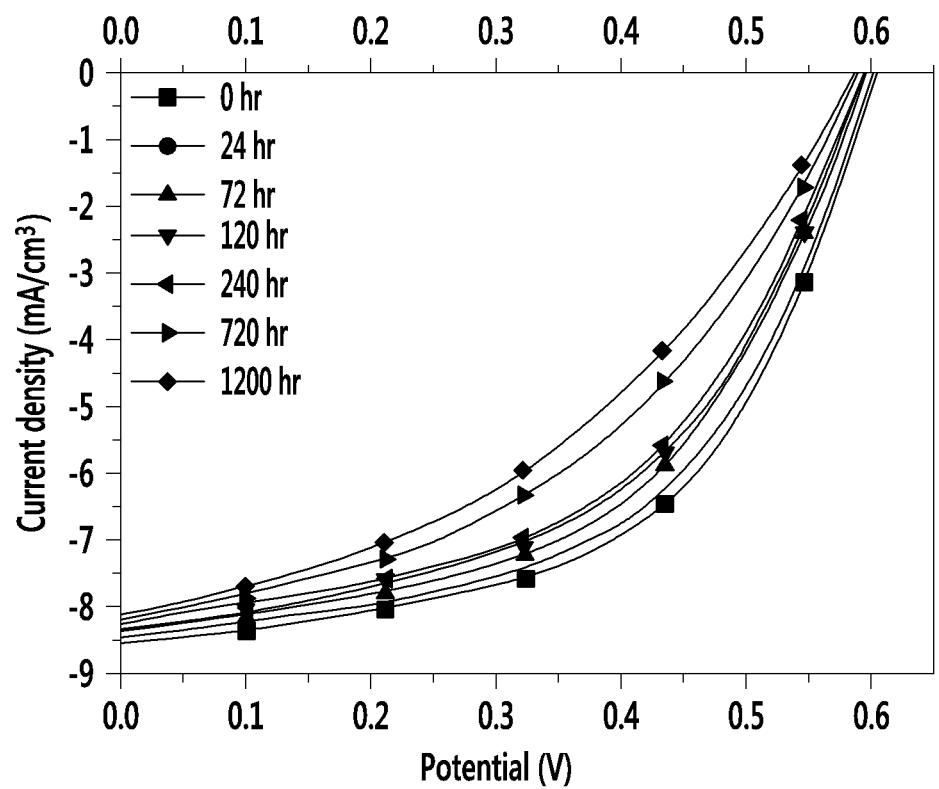
FIG. 14 is a graph showing current density change of a solar cell according to Example 1.
Figure 15:
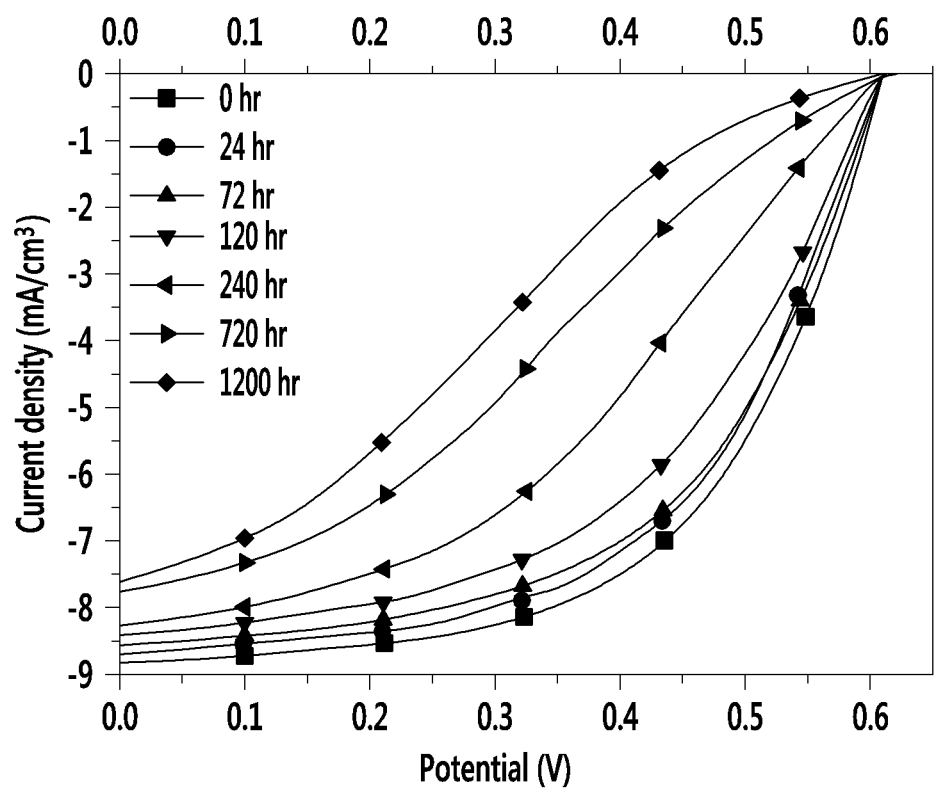
FIG. 15 is a graph showing current density change of a solar cell according to Comparative Example 1.
Figure 16:
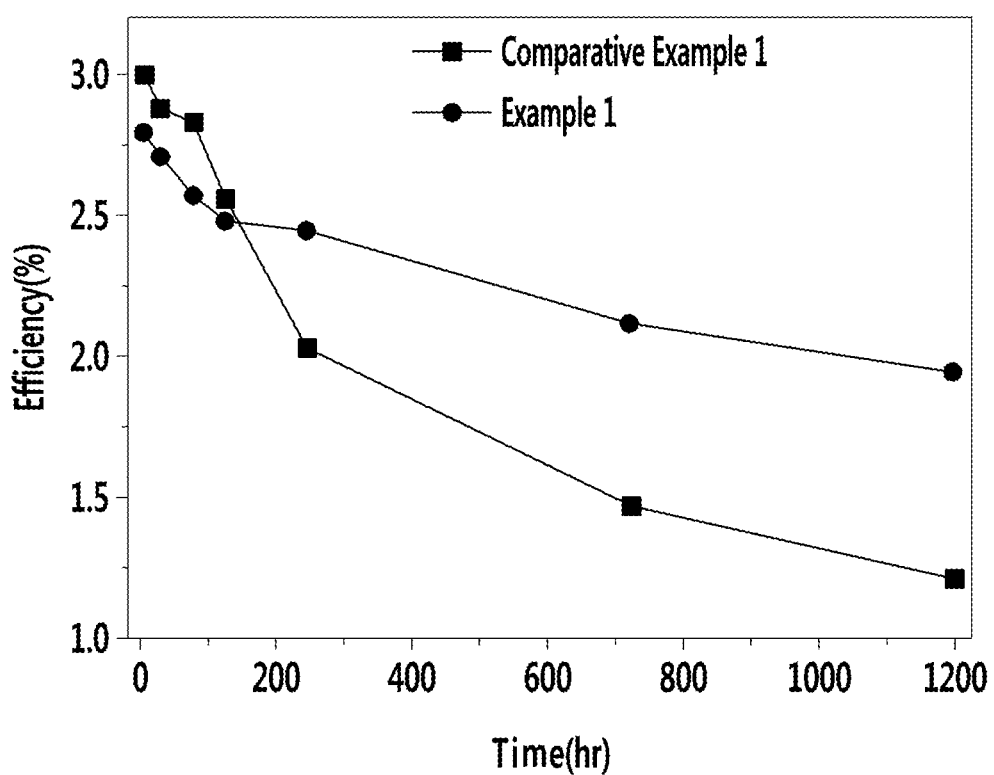
FIG. 16 is a graph showing efficiency change of the solar cells according to Example 1 and Comparative Example 1.

The results are provided in FIGS. 14 to 16 and Table 2.

FIG. 14 is a graph showing current density change of the solar cell according to Example 1, FIG. 15 is a graph showing current density change of the solar cell according to Comparative Example 1, and FIG. 16 is a graph showing efficiency change of the solar cells according to Example 1 and Comparative Example 1 depending on time.

TABLE 2

|  | Initial efficiency ($\eta_{0\,h}$) | Efficiency after 1200 hours ($\eta_{1200\,h}$) | Efficiency maintenance ratio (%) |
| --- | --- | --- | --- |
| Example 1 | 2.8 | 2.0 | 71 |
| Comparative Example 1 | 3.0 | 1.2 | 40 |

Referring to FIGS. 14 and 15, the solar cell according to Example 1 has a smaller current density change than the one according to Comparative Example 1 depending on time. In addition, referring to FIG. 16 and Table 2, the solar cell according to Example 1 has a high efficiency maintenance rate after being stored for a long period compared with the one according to Comparative Example 1.

Accordingly, the solar cell according to Example 1 has an improved life-span characteristic compared with the one according to Comparative Example 1.

Evaluation 3-2

The solar cells according to Example 2 and Comparative Example 2 are evaluated regarding life-span characteristic.

The life-span characteristic is evaluated by comparing efficiency change, while the solar cells according to Example 2 and Comparative Example 2 are operated in a globe box under a nitrogen atmosphere for 14 days if necessary.

Figure 17:
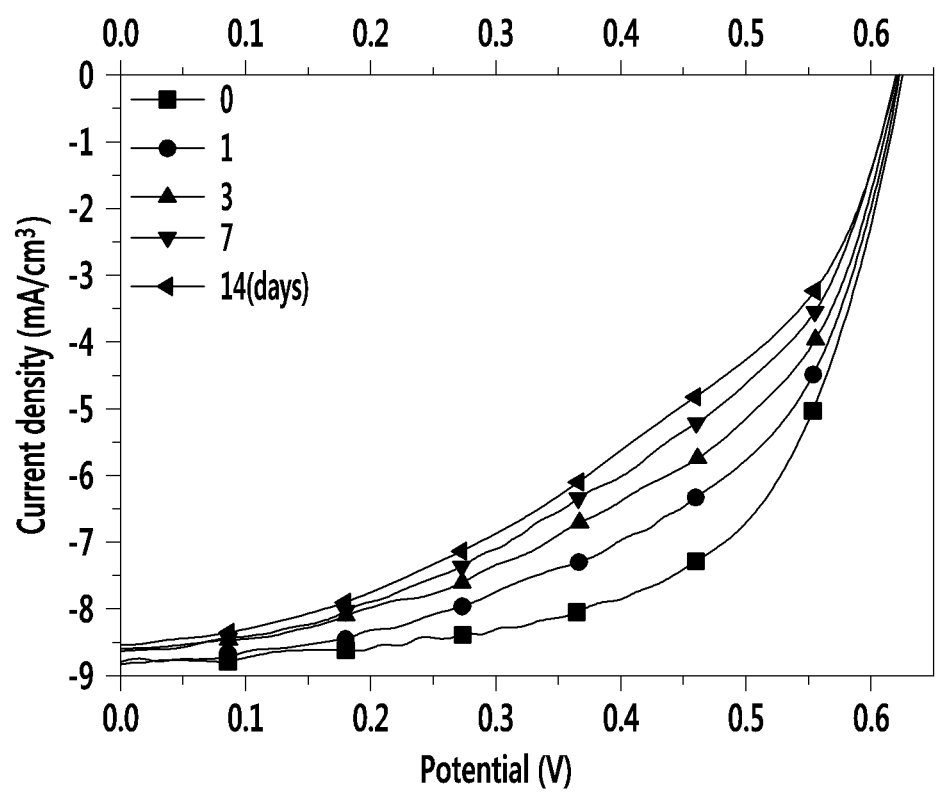
FIG. 17 is a graph showing current density change of the solar cell according to Example 2.
Figure 18:
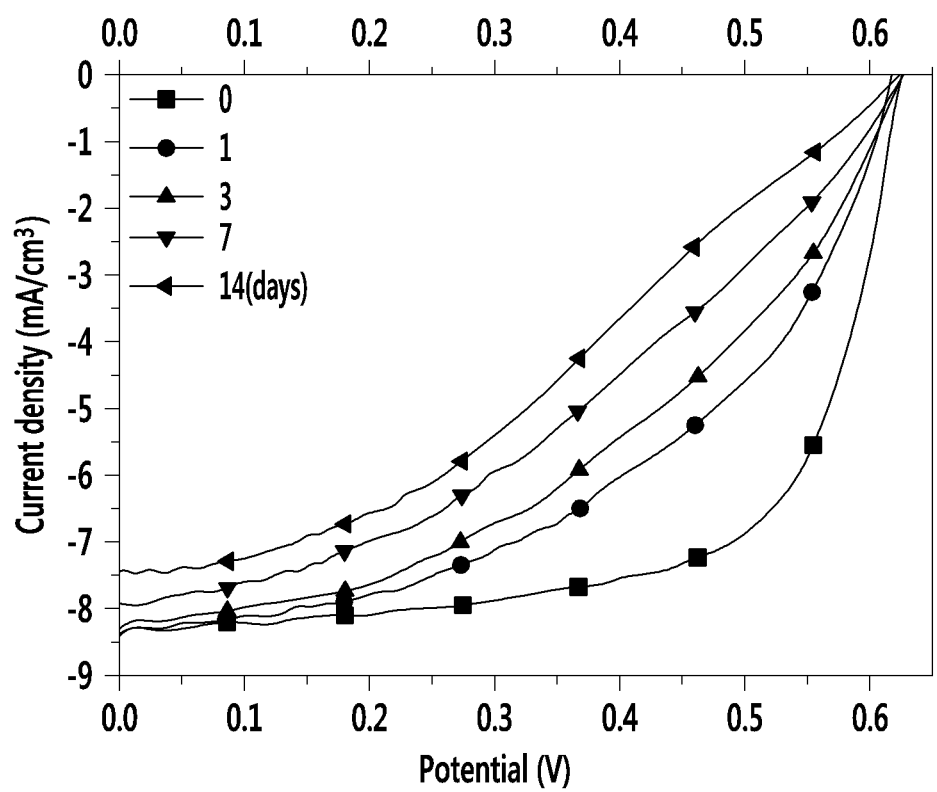
FIG. 18 is a graph showing current density change of the solar cell according to Comparative Example 2.
Figure 19:
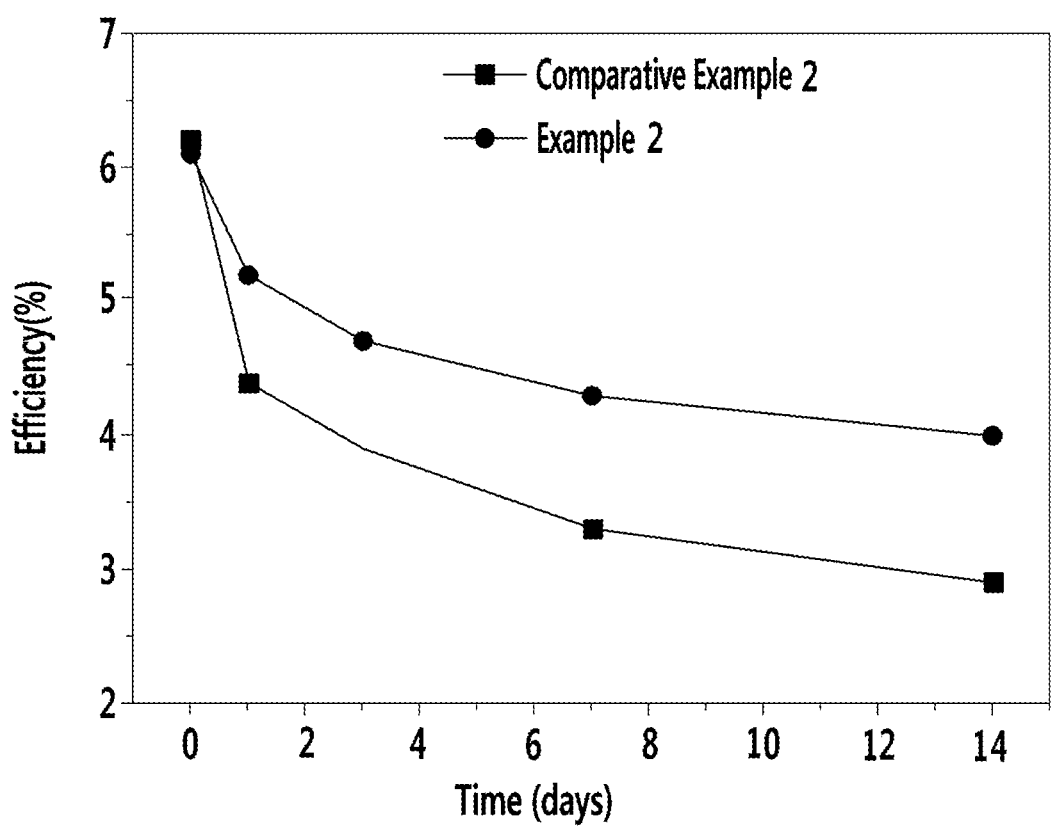
FIG. 19 is a graph showing efficiency change of the solar cells according to Example 2 and Comparative Example 2 depending on time.

The results are provided in FIGS. 17 to 19 and Table 3.

FIG. 17 is a graph showing current density change of the solar cell according to Example 2, FIG. 18 is a graph showing current density change of the solar cell according to Comparative Example 2, and FIG. 19 is a graph showing efficiency change of the solar cells according to Example 2 and Comparative Example 2.

TABLE 3

|  | Initial efficiency ($\eta_{0\,h}$) | Efficiency after 14 days ($\eta_{14\,d}$) | Efficiency maintenance ratio (%) |
| --- | --- | --- | --- |
| Example 2 | 6.1 | 4.0 | 66 |
| Comparative Example 2 | 6.2 | 2.9 | 47 |

Referring to FIGS. 17 and 18, the solar cell according to Example 2 has a smaller current density change than the one according to Comparative Example 2. In addition, referring to FIG. 19 and Table 3, the solar cell according to Example 2 has a higher efficiency maintenance rate compared with the one according to Comparative Example 2 after being stored for a relatively long period.

Accordingly, the solar cell according to Example 2 has an improved life-span characteristic compared with the one according to Comparative Example 2.

Evaluation 4

The solar cells according to Example 1 and Comparative Example 3 are evaluated regarding their current characteristic.

The current characteristic is evaluated by supplying the solar cells according to Example 1 and Comparative Example 3 with a light of 100 mW/cm$^2$ using an Oriel xenon lamp having an AM 1.5G filter.

Figure 20:
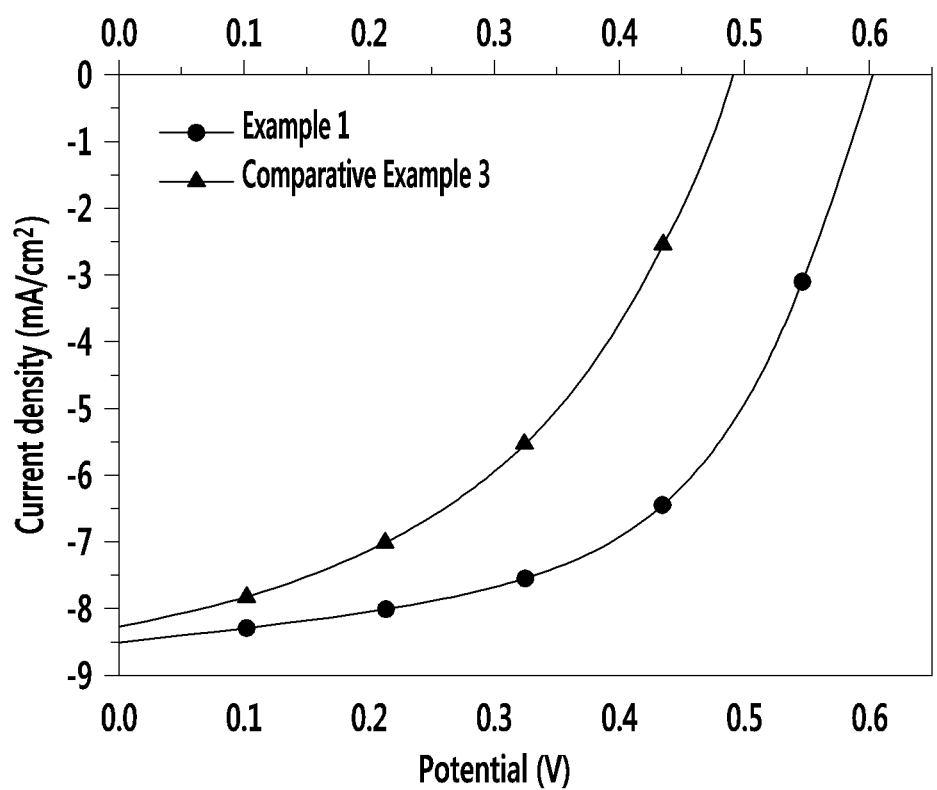
FIG. 20 is a graph showing current characteristics of the solar cells according to Example 1 and Comparative Example 3.

The results are provided in FIG. 20.

FIG. 20 is a graph showing the current characteristic of the solar cells according to Example 1 and Comparative Example 3.

Referring to FIG. 20, the solar cell according to Example 1 has an improved current characteristic compared with the one according to Comparative Example 3.

While this disclosure has been described in connection with what is presently considered to be practical example embodiments, it is to be understood that the inventive concepts are not limited to the disclosed embodiments, but, on the contrary, is intended to cover various modifications and equivalent arrangements included within the spirit and scope of the appended claims.

The invention claimed is:

1. A method of forming a hydrophilic thin film, comprising:
    coating one side of a transferring stamp including a support and a hydrophilic polymer layer with a hydrophilic solution to form a transfer layer, the hydrophilic polymer layer including a curable resin and a hydrophilic compound, the hydrophilic compound including a hydroxyl group; and
    transferring the transfer layer to a substrate,
    wherein the hydrophilic polymer layer has a hydrophilic property, and the hydrophilic polymer layer is formed entirely on one side of the support, and
    wherein the curable resin comprises polyurethane acrylate, and the hydrophilic compound comprises poly(ethylene glycol)diacrylate and 2-hydroxy-2-methyl propiophenone.

2. The method of claim 1, wherein the hydrophilic compound further comprises an ethylene glycol group.

3. The method of claim 1, wherein
    the support comprises one of polycarbonate (PC), polymethylmethacrylate (PMMA), polyethersulfone (PES), polyethylene terephthalate (PET), polystyrene (PS), a copolymer thereof, and a combination thereof.

4. The method of claim 1, wherein the hydrophilic polymer layer has a contact angle of less than or equal to about 80 degrees.

5. The method of claim 1, wherein the coating coats the one side of the transferring stamp by a process including one of spin coating, slit coating, and inkjet printing.

6. The method of claim 1, wherein the transferring transfers the transfer layer to the substrate by pressing at about 20 to 200° C. on the substrate.

7. The method of claim 1, wherein the coating coats the one side of the transferring stamp including the hydrophilic polymer layer with an acidic solution having a pH of 1 to 6.

8. The method of claim 1, wherein the coating coats the one side of the transferring stamp including the hydrophilic polymer layer with one of poly(3,4-ethylenedioxythiophene):poly(styrenesulfonate) (PEDOT:PSS), poly(3,4-ethylenedioxythiophene):poly(styrenesulfonate): poly(ferricsulfonate):Nafion® (PEDOT:PSS:PFS:Nafion®), and a combination thereof.

9. The method of claim 1, wherein the transferring transfers the transfer layer to the substrate including one of indium tin oxide (ITO) and indium zinc oxide (IZO).

10. A method of manufacturing an electronic device, comprising:
 forming a first electrode;
 forming an auxiliary layer on the first electrode including,
  coating one side of a transferring stamp including a support and a hydrophilic polymer layer with a hydrophilic solution to form a transfer layer, the hydrophilic polymer layer including a curable resin and a hydrophilic compound, the hydrophilic compound including a hydroxyl group, and
  transferring the transfer layer onto the first electrode;
 forming an active layer on the auxiliary layer; and
 forming a second electrode on the active layer,
 wherein the hydrophilic polymer layer has a hydrophilic property, and the hydrophilic polymer layer is formed entirely on one side of the support, and
 wherein the curable resin comprises polyurethane acrylate, and the hydrophilic compound comprises poly(ethylene glycol)diacrylate and 2-hydroxy-2-methyl propiophenone.

11. The method of claim 10, wherein the hydrophilic compound further comprises an ethylene glycol group.

12. The method of claim 10, wherein
 the support comprises one of polycarbonate (PC), polymethylmethacrylate (PMMA), polyethersulfone (PES), polyethylene terephthalate (PET), polystyrene (PS), a copolymer thereof, and a combination thereof.

13. The method of claim 10, wherein the hydrophilic polymer layer has a contact angle of less than or equal to about 80 degrees.

14. The method of claim 10, wherein the coating coats the one side of the transferring stamp by a process including one of spin coating, slit coating, and inkjet printing.

15. The method of claim 10, wherein the transferring transfers the transfer layer to the substrate by pressing at about 20 to 200° C. on the substrate.

16. The method of claim 10, wherein the coating coats the one side of the transferring stamp including the hydrophilic polymer layer with an acidic solution having a pH of 1 to 6.

17. The method of claim 10, wherein the coating coats the one side of the transferring stamp including the hydrophilic polymer layer with one of poly(3,4-ethylenedioxythiophene):poly(styrenesulfonate) (PEDOT:PSS), poly(3,4-ethylenedioxythiophene):poly(styrenesulfonate):poly(ferricsulfonate):Nafion® (PEDOT:PSS:PFS:Nafion®), and a combination thereof.

18. The method of claim 10, wherein the first electrode comprises indium tin oxide (ITO) or indium zinc oxide (IZO).

* * * * *